(12) United States Patent
Twomey et al.

(10) Patent No.: US 9,871,029 B2
(45) Date of Patent: Jan. 16, 2018

(54) BUS DRIVER / LINE DRIVER

(71) Applicant: ANALOG DEVICES GLOBAL, Hamilton (BM)

(72) Inventors: John Twomey, Fountainstown (IE); Brian Sweeney, Burren (IE); Brian B. Moane, Raheen (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/149,079

(22) Filed: May 6, 2016

(65) Prior Publication Data

US 2017/0323879 A1    Nov. 9, 2017

(51) Int. Cl.
*H03K 17/687* (2006.01)
*H01L 27/02* (2006.01)
*H01L 29/78* (2006.01)
*H03K 5/08* (2006.01)

(52) U.S. Cl.
CPC ...... *H01L 27/0255* (2013.01); *H01L 29/7802* (2013.01); *H01L 29/7816* (2013.01); *H03K 5/08* (2013.01); *H03K 17/6871* (2013.01)

(58) Field of Classification Search
CPC ............. H03K 17/0822; H03K 17/687; H03K 17/162; H03K 17/18; H03K 17/6871; H03K 17/94; H03K 19/0175; H03K 3/00; H03K 4/94; H03K 3/12
USPC .......................... 327/108, 109, 110, 111, 112
See application file for complete search history.

(56) References Cited

U.S. PATENT DOCUMENTS

| | | | |
|---|---|---|---|
| 5,414,314 A | 5/1995 | Thurber, Jr. | |
| 6,331,794 B1 * | 12/2001 | Blanchard | H03K 17/063 327/112 |
| 7,570,089 B2 | 8/2009 | Ronan et al. | |
| 8,816,389 B2 | 8/2014 | Coyne | |
| 2002/0113628 A1 * | 8/2002 | Ajit | G11C 5/14 327/108 |
| 2003/0094977 A1 * | 5/2003 | Li | H03F 3/45237 327/65 |

* cited by examiner

*Primary Examiner* — John Poos
(74) *Attorney, Agent, or Firm* — Patent Capital Group

(57) ABSTRACT

A bus driver is provided that can withstand over voltages being applied to its output terminal without the protection circuit detracting from the voltage swing that can be provided by the driver. The circuit arrangement also allows transistors having good on state resistance and large tolerance of drain-to-source voltages to be used.

13 Claims, 8 Drawing Sheets

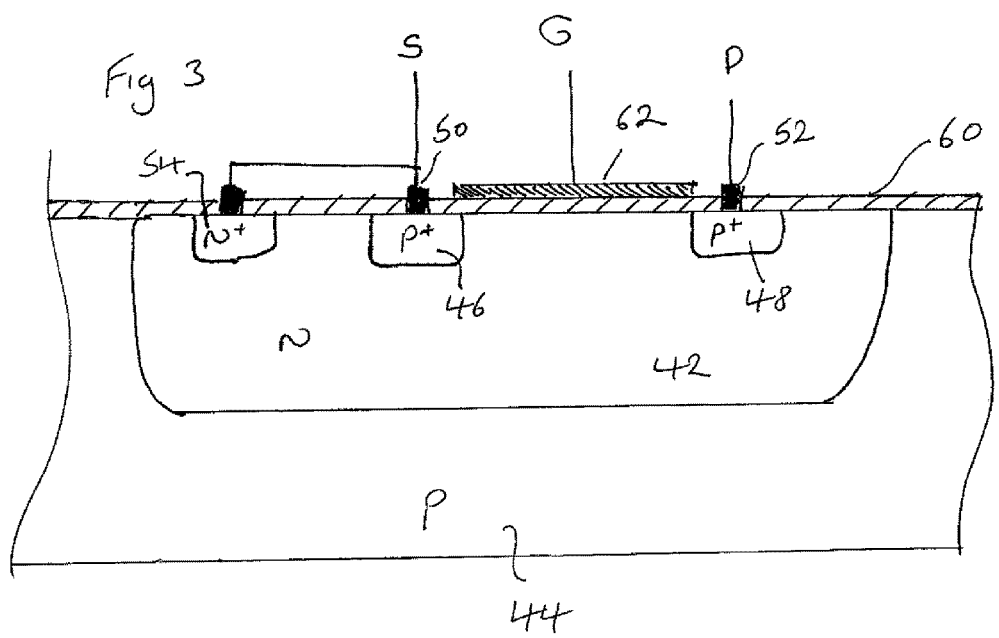

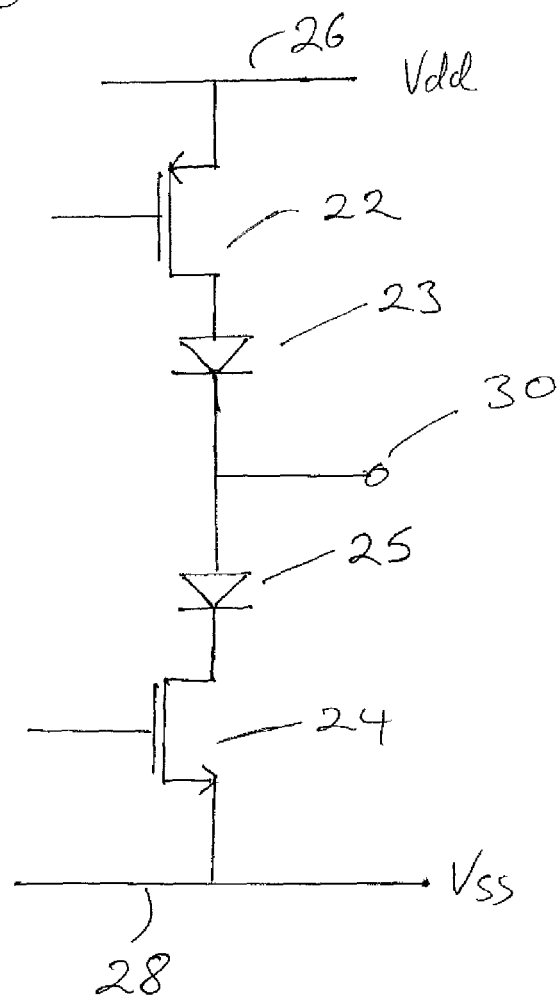

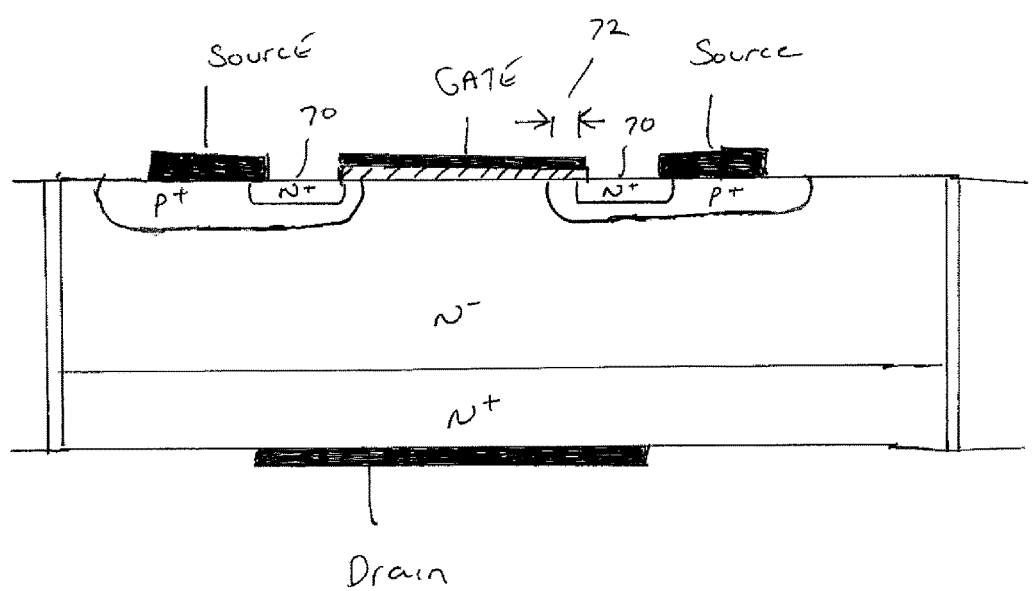

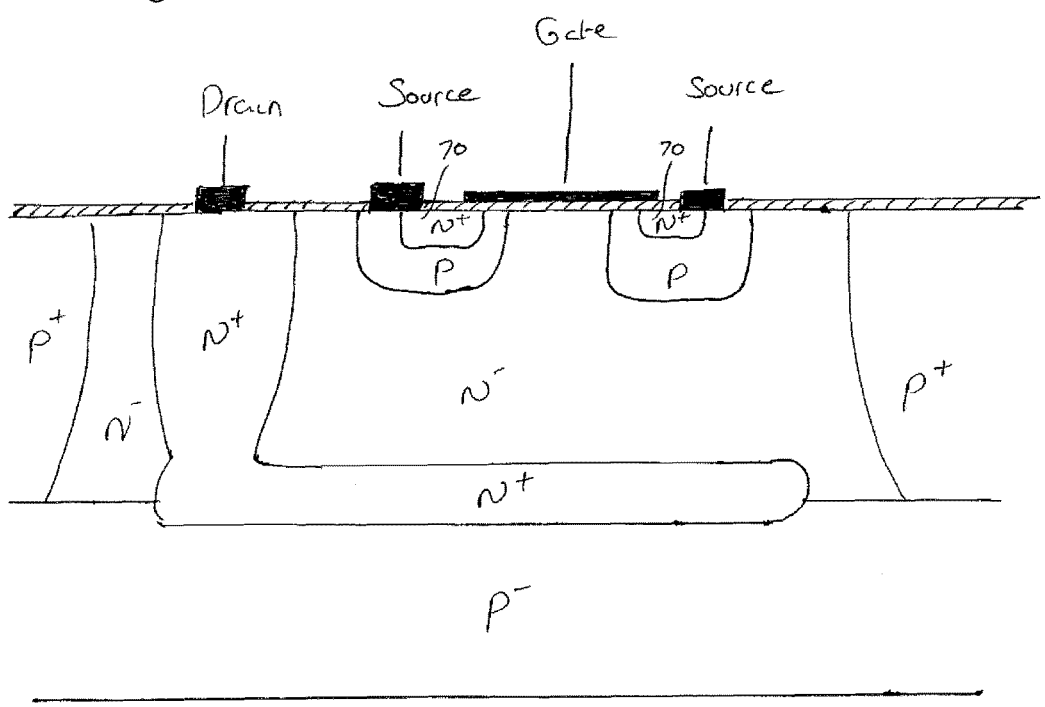

BUS DRIVER / LINE DRIVER

TECHNICAL FIELD

The present disclosure relates to a bus driver or line driver having improved protection against overvoltage conditions at its output node.

BACKGROUND

Data communication standards such as RS485 and RS232 have been used for a long time and have become well established. Consequently there is a continuing desire to be able to exchange data in conformity with these standards. The RS485 standard requires that a bus driver be able to drive a differential signal of at least 1.5 volts across a 54 ohm load. The RS 422 standard requires a bus driver to be able to supply a 2 volt single ended signal across a 100 ohm load.

Bus drivers may be connected in parallel to a shared bus. Therefore each driver output stage needs to be able to be placed in a high impedance state if the connected bus drivers are not to fight one another. This condition, when multiple drivers are connected to a shared bus and are active at the same time is known as "bus contention". Drivers which are able to be placed into a high impedance state are commonly known as "tri-state drivers".

Additionally, bus drivers must also be robust against the risk that a given bus driver is not powered up, but that a voltage has been applied to a bus to which the driver is connected. Under such conditions the driver must not exit from a high impedance state and must not open an uncontrolled current flow path between the bus and the power supply rails of the bus driver or between the bus and the signal path to the components that drive the bus driver. Furthermore the bus driver must be robust against overvoltage events that might occur from switching off inductive loads or the like in, for example, industrial, avionic, nautical or automotive environments.

BRIEF DESCRIPTION OF THE DRAWINGS

Embodiments of the present disclosure will now be described, by way of non-limiting example only, with reference to the accompanying drawings, in which:

FIG. 3 is a cross-section through a lateral MOSFET as typically available as part of a CMOS fabrication process;

FIG. 4 is a circuit diagram of a modification to the driver circuit of FIG. 2 to include protection diodes;

FIG. 5a is a cross-section through a vertical DMOS transistor, and FIG. 5b is a cross-section through a lateral DMOS transistor;

DETAILED DESCRIPTION

Figure 1:
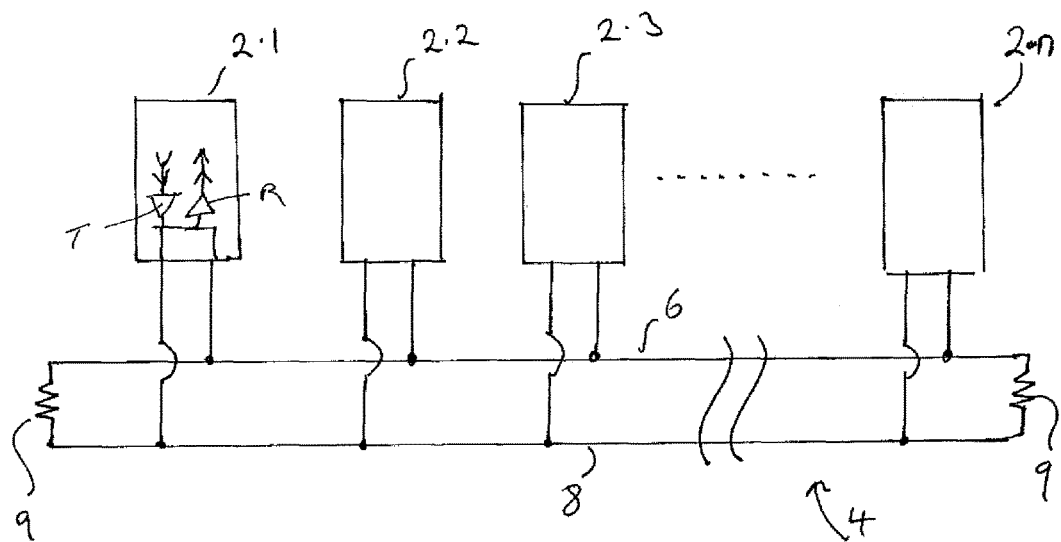
FIG. 1 is a circuit diagram of a CAN bus having multiple devices able to communicate over a shared two wire bus.

In a first aspect of the present disclosure a line driver/bus driver is provided comprising DMOS transistors connected between an output node and first and second power rails. The transistors are connected in back to back configuration.

Connecting the transistors in a back to back configuration causes the intrinsic body diodes of pairs of the transistors to be opposed to each other, thereby inhibiting uncontrolled current flow in the event of the voltage at the output node falling outside of the voltage range defined by the first and second power rails.

Where the transistors are interposed between the output node and a positive supply rail, the first DMOS transistor is a P-type DMOS transistor and has its drain connected to the output node and its gate connected to a first control mode to receive a first data signal. A source of the first DMOS transistor is connected to the source of a second DMOS transistor which is a P-type DMOS transistor. A drain of the second DMOS transistor is connected to the first (positive) supply rail. A gate of the second DMOS transistor is connected to a second control node to receive a second control signal which is used to enable the buffer or to place it in a high impedance state.

Preferably a first voltage limiting component is connected between the source of the first DMOS transistor and the gate of the first DMOS transistor. A second voltage limiting component may also be provided to limit the voltage difference between the first and second control nodes or between the second control node and the source of the second DMOS transistor.

Preferably the bus driver further includes third and fourth DMOS transistors which are N-type DMOS transistors, where the transistors are connected in series between the output node and the second supply rail, which can be regarded as being the negative supply rail or a local ground. The third DMOS transistor has its drain connected to the output node and its source connected to the source of the fourth DMOS transistor. A gate of the third DMOS transistor is connected to a third control node where it can receive a data signal. A third voltage limiting component is connected between the source of the third DMOS transistor and the gate of the third DMOS transistor. The fourth DMOS transistor has its drain connected to the second supply rail, i.e. connected to the negative supply rail. A gate of the fourth DMOS transistor is connected to a fourth control node and is operatively connected to a voltage limiting component so as to limit its voltage excursion with respect to either the third control node or the source of the fourth DMOS transistor.

In some embodiments the driver is provided as a differential bus driver. In such an arrangement fifth DMOS transistor which is a P-type DMOS transistor may be provided having its drain connected to a second output node, its gate connected to a fifth control terminal and its source connected to the source of the second DMOS transistor. A fifth voltage limiting component is operatively connected between the gate and the source of the fifth DMOS transistor. A sixth transistor which is an N-type DMOS transistor is also provided having its drain connected to the second output node and its source connected to the source of the fourth DMOS transistor. A gate of the sixth DMOS transistor is connected to a sixth control node and a sixth voltage limiting component is operatively connected between a gate of the sixth DMOS transistor and the source of the sixth DMOS transistor.

There is often a need for multiple devices to be able to exchange information with one another. Such an arrangement is schematically illustrated in FIG. 1 where several computing, data acquisition, processing or actuator control devices 2.1, 2.2, 2.3 to 2.n are connected to a shared two wire bus 4. The bus may be a two wire bus comprising a first conductor 6 and a second conductor 8 terminated by termination resistors 9. The devices 2.1 to 2.n may both receive data from the bus and place data onto the bus by way of receivers R and transmitters T shown for device 2.1. Interaction between the various devices 2.1 to 2.n may be controlled by a bus communications protocol. The arrangement shown in FIG. 1 might, for example, be part of a controller area network (can bus) which is a commonly used vehicle bus. The bus can be regarded as representing a load connected to the output of each of the devices 2.1 to 2.n and it is common to provide an interface between those devices and a bus by way of a bus driver. A bus driver is often integrated within its respective device 2.1 to 2.n.

Figure 2:
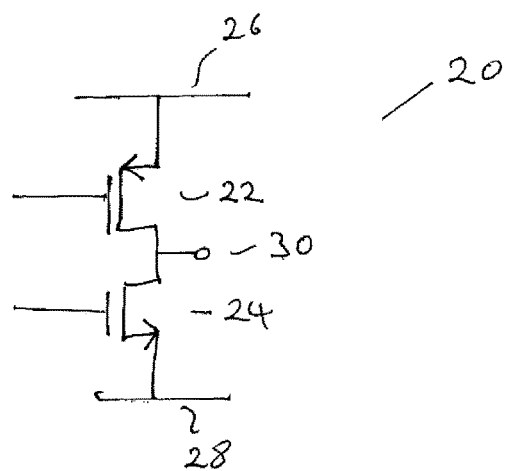
FIG. 2 is a circuit diagram of a known bus-driver circuit.

FIG. 2 schematically illustrates an embodiment of a simple prior art bus driver. The bus driver, generally designated 20, comprises two transistors 22 and 24 arranged in series between two power rails 26 and 28. The first transistor is a P-type device and its source is connected to the positive supply rail and its drain connected to the drain of the second transistor 24. A source of the second transistor 24, which is an N-type device, is connected to the negative or ground rail 28. A node 30 formed by the interconnection between the drains of the transistors 22 and 24 acts as an output node. It can be seen that if the gate voltages of both the transistors 22 and 24 are low, e.g. close to the supply rail 28 then only transistor 22 is on and hence node 30 is, in effect, connected to the positive supply rail 26 by way of transistor 22. Similarly, if the gate voltages of the transistors 22 and 24 are high, e.g. close to the voltage of supply rail 26, then only transistor 24 is on and consequently node 30 is pulled down to the supply voltage of the supply rail 28. Finally, if the gate voltage of the transistor 22 is high and a gate voltage of the transistor 24 is low then both transistors are switched off and node 30 is placed in a high impedance state. This works well as long as the voltage at node 30 always lies between the voltages on nodes 26 and 28. However, for a system comprising multiple devices connected to a shared bus this cannot be guaranteed because a device might be unpowered whilst other devices are powered. This can cause an uncontrolled current flow path to open up one of the supply rails. In order to put the teachings of the present disclosure in context, it is useful to consider why such a problem exists.

FIG. 3 schematically illustrates a lateral transistor as is typically provided with a CMOS fabrication process. FIG. 3 shows a cross section through a P-type device where an N-type bulk region 42 may, as shown here, be formed as a well within a P-type substrate 44. P-type diffusions 46 and 48 are formed into the N-type material 42 to form the drain and source. Highly doped regions (not shown) may be formed in the regions 46 and 48 to enhance ohmic connection to metallic contacts 50 and 52. An upper surface of the device is covered with a dielectric layer 60 and a gate 62 is formed over the dielectric layer 60 extending between the drain and source regions 46 and 48. Often a connection is made to the N-type layer 42 by way of a highly doped N-type region 54 in order to define its voltage and the layer 42 is then connected to the source terminal 50 of the FET. This helps make the on state performance of the transistor more reliable. If we assume for simplicity that region 48 forms the drain of the transistor and region 46 forms the source then the transistor of FIG. 3 would correspond to the transistor 22 in FIG. 2 and the source would be connected to the most positive supply rail 26 and the drain would be connected to the output node. However the construction of the MOSFET shown in FIG. 3 also gives rise to an intrinsic body diode that opens up a uncontrollable conduction path under certain circumstances. The diode exists between the drain doping 48 and N-type material 42, with a conduction path to the source S being made by way of doping 54 and the connection from region 54 to the source 46. Thus, in the arrangement shown in FIG. 2 if node 30 becomes more positive than supply rail 26 by one diode drop, approximately 0.7 volts in the silicon, then current flow occurs between node 30 and supply rail 36. Similarly, if node 30 drops below the voltage of supply rail 28 then a conduction path is opened through the N-type transistor 24 where that conduction path continues irrespective of the gate voltage.

In prior art systems this unwanted current flow can be prevented by the inclusion of two further diodes 23 and 25 in the current flow paths between the supply rail 26 and the output 30, as shown in FIG. 4, such that one or other of the diodes becomes reversed biased when the voltage at node 30 falls outside of the supply range of the supply rails 26 and 28. This solution works appropriately well when the voltage difference between the rails 26 and 28 is sufficient to support the additional diode voltage drop and the drop across the transistors in the "on" state and still meet the requirements of the relevant bus communication standard. However each of these diodes 23 and 25 also reduces the peak to peak voltage swing from the output node. Thus, the inclusion of the diode 23 in the high side path associated with transistor 22 reduces the maximum output voltage at node 30 by about 0.7 or 0.8 volts. Similarly the inclusion of a protection diode 25 in the low side path associated with the transistor 24 increases the minimum voltage at node 30 by about 0.7 or 0.8 volts. Therefore it can be seen that the inclusion of two protection diodes 23 and 25 reduces the voltage swing available from the output of the bus/line driver by approximately 1.5 volts.

This reduction in output voltage swing is in conflict with a trend to move towards lower and lower supply voltages in order to reduce the dissipation within circuits and also to have smaller faster transistors. Thus, if a circuit of the type shown in FIG. 4 was provided with a three volt supply then the maximum voltage swing at node 30 would be reduced, under no load conditions, to about 1.5 volts and this swing might become subsequently reduced by the interaction of current flow of the on resistance of the driver transistors. It can be seen that under such circumstances the circuit would barely meet the required differential drive voltage of 1.5 volts for the RS485 standard and would fail to meet the two volts swing required for the RS422 standard. There is therefore a need to dispense with the series connected diodes used in prior art implementations.

There is also a requirement for the transistors within the bus driver to have good performance in terms of their on state drain-source resistance $R_{DSon}$ compared to the area that they consume and the drain to source voltage that they can stand in their off state without breaking down. A transistor configuration which is recognized as providing good on state resistance and able to withstand a high drain to source voltage is the DMOS transistor. DMOS transistors are available in both vertical and planar configurations examples of which are shown in FIGS. 5a and 5b respectively. In the illustrated DMOS structure first regions are implanted as a relatively elongate layers and then a further oppositely doped implant 70 is implanted into each first region so as to form the source and a thin channel 72. This first region effectively forms the back gate and is connected to the same metallization as the source implant 70. The gate 74 extends between the implants 70. The structure gives rise to a fast transistor with low on state resistance. However it also gives rise to a device which can only withstand a relatively low gate to source voltage difference before damage occurs. This is due to the thinness of the oxide layer separating the gate from the semiconductor substrate. An increase in the gate thickness would increase the gate to source voltage that can be withstood before damage occurred but at the expense of the device on state performance. The back gate of the DMOS is, by nature of its construction, inaccessible and hence steps cannot be taken to protect the transistor from damage by virtue of changes to the internal configuration of the transistor. Furthermore, like other FETS, the DMOS transistor has a parasitic diode between the drain and the source when the transistor is reversed biased.

U.S. Pat. No. 5,414,314 discloses a bus driver comprising two P-type transistors connected between a positive supply Vcc and an output node "out" as shown in FIG. 3 of that patent. A drain of one of the P-type transistors is connected to Vcc, a drain of the other of the P-type transistors is connected to the output node, and the sources are connected together at node P1.

U.S. Pat. No. 5,414,314 teaches at column 3 lines 34 to 50 that in a high impedance mode the "DE" signal shown in FIG. 3 is high, PG is high and NG is low. This causes N16 and P17 to be held off, and P15 and N14 are held on. As a result the four output devices all have $V_{gs}=0$ causing them all to be off whether the output voltage is in between the supply voltages or above or below the supplies. However, specifically U.S. Pat. No. 5,414,314 teaches "The only limitation to this is that the breakdown of the devices must be greater than the fault voltage". This makes the circuit unsuitable for use with double diffused metal on silicon field effect transistors, DMOS, (although it should be noted that the "metal" is typically some other conductor such as doped silicon) where the maximum gate to source voltage before breakdowns occurs is typically 5 volts or less. If, for example the voltage at the output node went above the supply rails (or the supply was not on) the intrinsic body diode of P11 of U.S. Pat. No. 5,413,314 will conduct taking node P1 high and turning on P15. Whilst this keeps the $V_{gs}$ of P10 low, it still means that P11 and P15 both experience the full overvoltage condition across them and their $V_{gs}$ can rise to the full magnitude of the overvoltage event at the output node. This would destroy DMOS devices. A similar analysis follows for the N-type transistors N12, N13 and N14.

The circuit in U.S. Pat. No. 5,414,314 has no protection components to limit $V_{gs}$ to acceptable levels.

Figure 6:
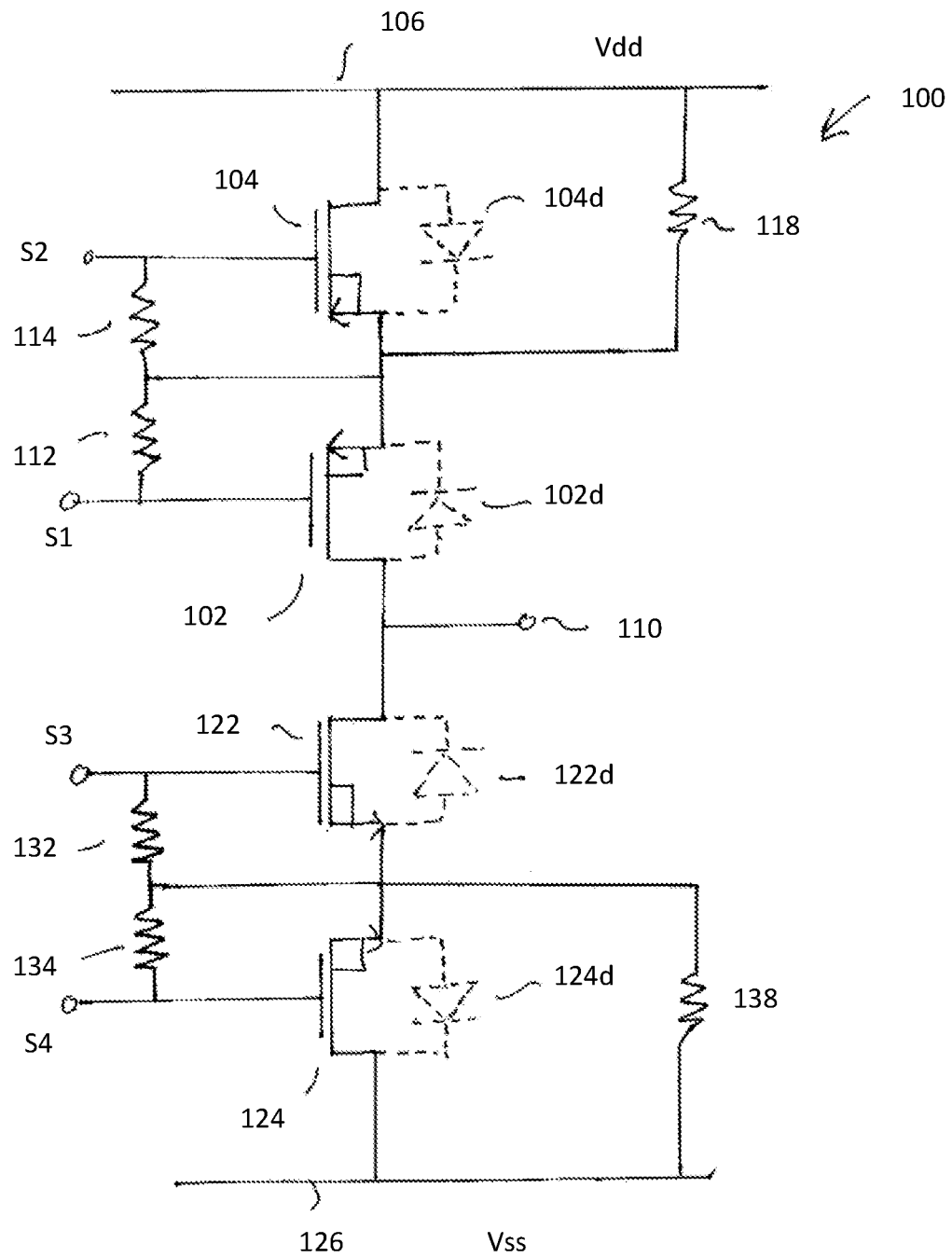
FIG. 6 is a circuit diagram of a bus driver constituting a first embodiment of this disclosure.

FIG. 6 is a circuit diagram of an embodiment of the disclosure where DMOS transistors are used in the driver circuit for their power handling, for their ability to withstand voltages between the drain and source and for their low on state resistance, but where the circuit configuration is adapted to protect the transistors from an excessive gate to source voltage in the event of voltages on the output node exceeding the supply rails, which could damage the gates of the transistors.

In the arrangement shown in FIG. 6 a first transistor 102, which is a P-type DMOS transistor is connected in series with a second transistor 104, which is also a P-type DMOS transistor 104 between positive supply rail 106 and an output node 110. The parasitic diodes associated with the first and second transistors 102 and 104 are shown in phantom as components 102d and 104d, respectively. A drain of the first transistor 102 is connected to the output node 110. A source of the transistor 102 is connected to a source of the second DMOS transistor 104. The drain of the second transistor 104 is connected to the supply rail 106. Voltage (and current) limiting devices in this example in a form of resistors 112 and 114 are provided such that the gate of the first transistor 102 is connected to the source of first transistor 102 and also the gate of the second transistor 104 is connected to the source of the transistor 102 by way of resistor 114. Additionally third and fourth transistors, 122 and 124, which are N-type DMOS transistors are provided in series between the output node 110 and a negative supply rail 126. The third DMOS transistor 122 has its drain connected to the output node 110 and its source connected to the source of the second N-type DMOS transistor 124. Parasitic diodes associated with the third and fourth transistors 122 and 124 are shown in phantom outline as components 122d and 124d. Resistors 132 and 134 connect the gates of the third and fourth DMOS transistors, respectively, to a node formed by connections between the sources of the third and fourth DMOS transistors. Thus it can be seen that the bottom half of the circuit is effectively a mirror of the top half of the circuit with the transistor technology being switched from P-type to N-type.

In use, the first transistor 102 is supplied with a data signal from a first signal node S1 in order to switch the transistor on or off such that it either acts to pull the output node 110 up to the supply rail 106 or is in a high impedance state. The first transistor 102 is in series with the second DMOS transistor 104 which is effectively operated as a switch. Optionally the second transistor may be parallel with a very high impedance resistor 118. The second DMOS transistor 104 is driven by a second control signal provided at node S2. The signal can either be used to switch transistor 104 into a highly conducting state, thereby effectively enabling the output stage, or to switch the transistor 104 off. Similarly the third DMOS transistor 122 receives a signal from a third signal node S3 which provides the data to control the transistor such that it is either in a high impedance state or acting to pull the node 110 down to the supply rail 136. Thus transistors 122 and 102 are driven such that only one of them is on at any given time and at no time is both of them on. The fourth transistor 124 receives a control signal for node S4 which serves either to put it in a low impedance state thereby effectively enabling the output stage, or to place it in a high impedance state to disable the output driver. The transistor 124 may be parallel with a large value resistor 138 which provides sufficient impedance to make the stage look as if it is in a tri-state high impedance configuration whilst providing a small current flow path such that following an overvoltage event the source of the transistors will return to the negative rail voltage.

Suppose, for example, that it is desired to drive node 110 towards the supply rail 106. The second transistor 104 and the fourth transistor 124 are both driven into a enabled state. Thus, the signal at control node S2 is held low so as to switch transistor 104 hard on, whereas the signal at control node S4 is held high so as to switch transistor 124 hard on. Transistor 102 is switched on by placing the voltage at node S1 in a low voltage configuration and similarly the third transistor 122 is switched off by placing the node S3 in a low voltage configuration.

If it was desired to transmit a zero by dragging node 110 towards the Vss voltage on supply rail 126 then nodes S1 and S3 would be taken to a relatively high voltage, i.e. towards the voltage of supply rail 106.

Thus it can be seen that when the driver is in a powered configuration it acts to drive the node 110 to one or other of the supply rails and that substantially no voltage is lost across the protection and tri-state devices formed by the second and fourth transistors.

In the event of an overvoltage occurring at node 110, i.e. the voltage there exceeds the voltage at supply rail 106, either because a large voltage occurs on the bus or because the supply rail 106 has not become established, and it can be seen that the parasitic diode 102d becomes forward biased and conducts. However the current flow is then blocked by transistor 104 which is switched off and also by its parasitic diode 104d which is reverse biased. Current flow by way of resistor 118 is negligible because it has such a large value.

As noted before, DMOS transistors cannot withstand a significant gate source voltage without incurring damage. Therefore steps have to be taken to prevent the transistors becoming damaged. This can be done by designing the drive circuits connected to nodes S1, S2, S3 and S4 such that they do not pass current if they are not being actively driven to drive their respective transistor 102, 104, 122 and 124, and also by the provision of a voltage limiting component extending between the gate of each transistor and the source of that transistor. In FIG. 6 the voltage limiting component is provided by way of resistor 112 between the gate of the first transistor 102 and the source of the first transistor 102. Similarly the resistor 114 extends between the gate and source of the second transistor, resistor 132 extends between the gate and source of the third transistor 122, and resistor 134 extends between the gate and source of the fourth transistor 124. Each of these resistors allows a very small amount of current flow in the event that the parasitic diode of that transistor becomes forward biased, thereby enabling the gate voltage to float towards the source voltage during overvoltage conditions. The voltage limiting resistors 112, 114 and 132 and 134 may be replaced by other components although care is needed in balancing the need to control limit the gate to source voltage while not opening a current flow path by allowing the transistor(s) to turn on.

Figure 7:
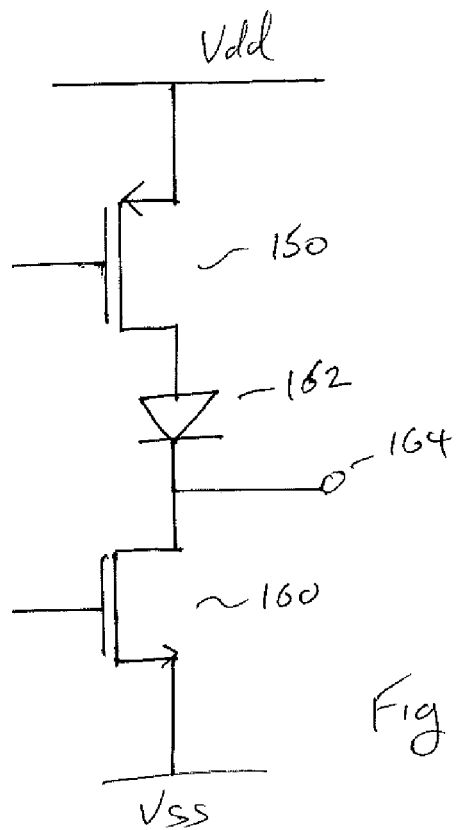
FIG. 7 is a circuit diagram of a pre-driver circuit suitable for driving nodes S1 and S2 of the circuit shown in FIG. 6.
Figure 8:
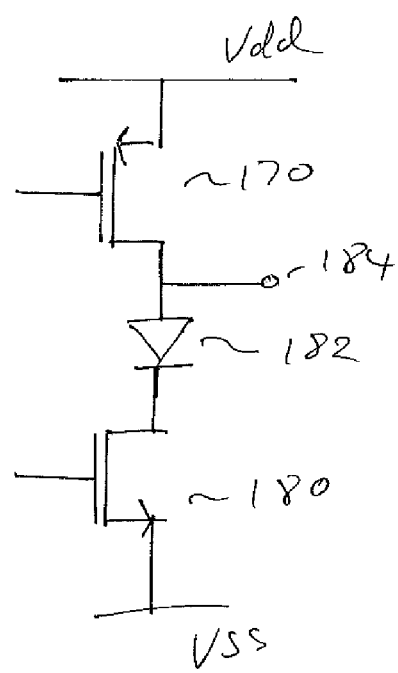
FIG. 8 is a circuit diagram of a pre-driver circuit suitable for driving nodes S3 and S4 of the circuit shown in FIG. 6.

In order for the voltage limiting components between the gates and source of each transistor to perform their job correctly, the first to sixth nodes should be driven by a pre-driver circuit which ensures that current flow does not occur through the pre-driver circuit in the event of the voltage at the output node of the line driver circuit exceeding the supply voltages. Put another way, the pre-driver circuit allows the gate voltage to follow the source voltage of the respective DMOS transistor under the action of the associated voltage limiting component. Because the voltage constraints are less significant for the pre-driver circuit one option would be to form the pre-driver circuit using the configuration shown in FIG. 4. However, more advantageously, the P-type transistors within the driver circuit can be driven using a pre-driver circuit of the type shown in FIG. 7 where a P-type transistor 150 and N-type transistor 160 are connected in series between the power rails Vdd and Vss and a diode 162 is interposed between the drain of the transistor 150 and the drain of the transistor 160. The cathode of the diode 162 represents an output node 164. Respective versions of the circuit shown in FIG. 7 can be used to provide the signals at nodes S1 and S2, with the transistors 150 and 160 being driven by control signals in an appropriate manner to either drive node 164 low or high. A tri-state condition is not required for the pre-driver circuit shown in FIG. 7. Similarly the pre-driver circuit illustrated in FIG. 8 also comprises a P-type transistor 170 and an N-type transistor 180 arranged in series configuration between the supply rails Vdd and Vss. A diode 182 is connected between the drain of the transistor 170 and the drain of the transistor 180, but now the anode of the diode 182 forms an output node 184. Circuits of the type shown in FIG. 8 are suitable for driving the circuit node S3 and S4 associated with the N-type transistors of FIG. 6. Only one protection diode 162 and 182 is required in each of the circuits of FIGS. 7 and 8 because the direction of voltage threat is now effectively unipolar because of the existence of the line driver of FIG. 6 between the output node 110 and the pre-driver circuit of FIG. 7 or FIG. 8.

Figure 9:
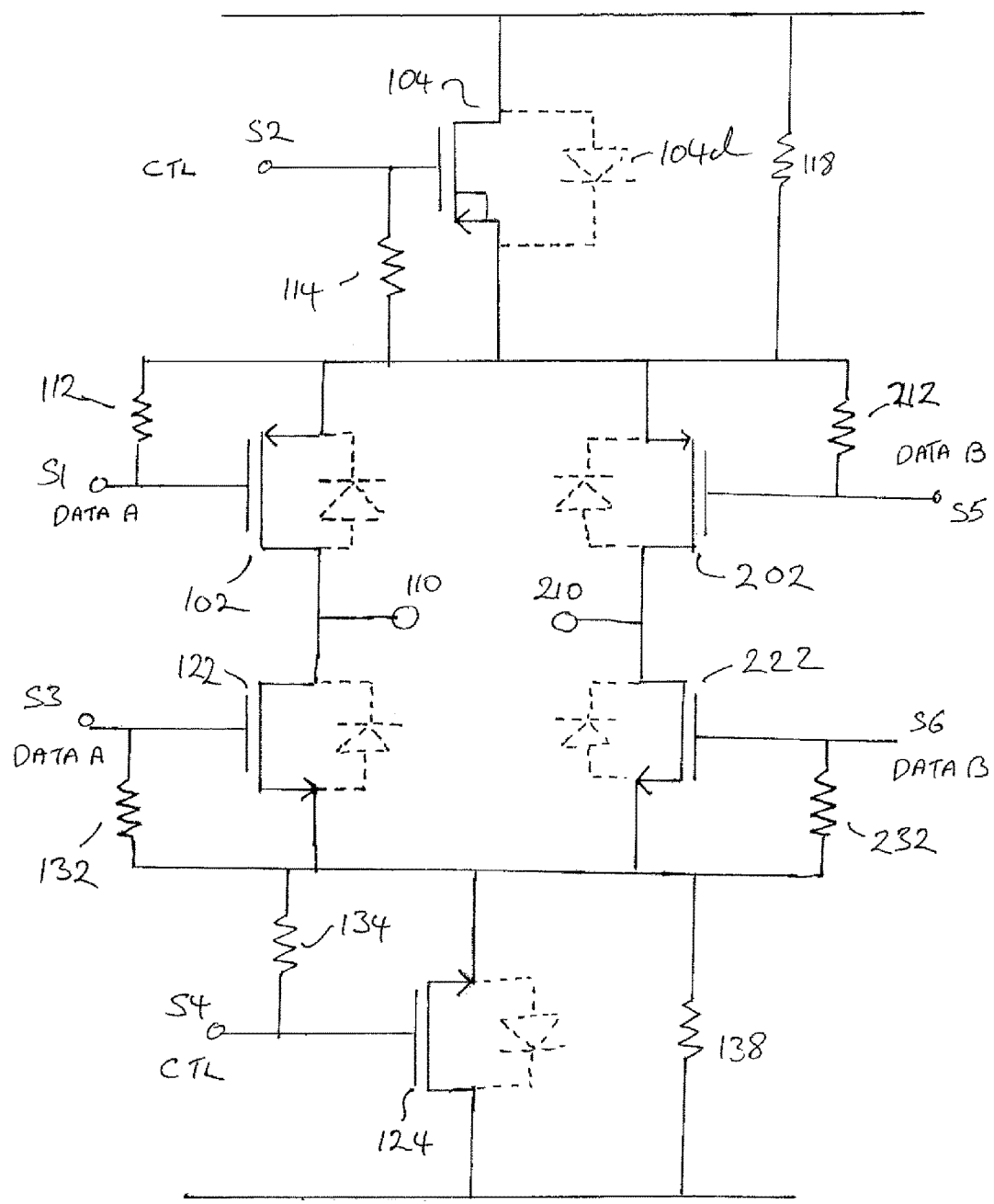
FIG. 9 is a circuit diagram of a differential bus driver constituting an embodiment of this disclosure.

The driver described so far, with respect to FIG. 6, has been a single ended bus driver. FIG. 9 shows a modification to a circuit of FIG. 6 to create a differential bus driver which only requires the addition of a further two transistors. A fifth transistor 202, which is a P-type DMOS transistor, is connected with its drain connected to a second output node 210 and its source connected to the source of the first and second transistors 102 and 104. A fifth voltage limiting component 212, for example in the form of a resistor, is connected between the gate and source of the fifth transistor 202. The gate of the transistor 202 is connected to a fifth input node S5 which receives a complimentary signal to that presented at the first data node S1. A sixth DMOS transistor 222 which is an N-type DMOS transistor has its drain connected to the second output node 210 and its source connected to the sources of the third and fourth transistors 122 and 124. A sixth voltage limiting device, in this example, in the form of a resistor 232 is connected between the gate of the sixth transistor and the source of the sixth transistor. The gate of the sixth transistor is connected to node S6 which receives a data signal which is complementary to that received at node S3.

It can be seen that this style of circuit uses fewer transistors than, for example, prior art designs such as that described in U.S. Pat. No. 5,414,314.

The nodes 110 and 210 may be associated with further electrostatic and overvoltage protection, for example as described in U.S. Pat. No. 8,816,389. The output driver at nodes 110 and/or 210 may be connected to a suitable bus, and an integrated circuit which contains the output driver may also contain a receiver for receiving data from the bus. The integrated circuit may comprise other components such as sensors, data processors, drive transistors, one or more isolators, such as the transformer based isolators sold by Analog devices, so as to provide isolation between the low voltage domain and the high voltage domain so as to provide high level functionality in a system on-chip style application where multiple functions are provided within a single integrated circuit (chip scale) package.

Devices as described herein can be implemented in various apparatuses. Examples of the electronic devices incorporating such devices can include high speed signal processing chips, power regulators, memory chips, memory modules, circuits of optical networks or other communication networks, and disk driver circuits. Products in which such electronics can be incorporated include, but are not limited to, consumer electronic products, parts of the consumer electronic products, electronic test equipment, etc. The consumer electronic products can include, but are not limited to, a mobile phone, cellular base stations, a telephone, a television, a computer monitor, a computer, a hand-held computer, a personal digital assistant (PDA), a microwave, a refrigerator, a stereo system, a DVD player, a CD player, an MP3 player, a radio, a camcorder, a camera, a digital camera, a portable memory chip, a washer, a dryer, a washer/dryer, a copier, a facsimile machine, a scanner, a multi-functional peripheral device, etc. Further, the electronic device can include unfinished products. The driver may also be included within industrial and automotive data networks.

Although various embodiments have been expressly described, other embodiments that are apparent to those of ordinary skill in the art, including embodiments that do not provide all of the features and advantages set forth herein, are also within the scope of this disclosure. Moreover, the various embodiments described above can be combined to provide further embodiments. In addition, certain features shown in the context of one embodiment can be incorporated into other embodiments as well.

The claims presented here are in single dependency format suitable for filing at the USPTO. However for the avoidance of doubt in jurisdictions which allow multiple dependency claiming, each claim is to be assumed to be dependent of any preceding claim of the same type except where that is clearly technically infeasible.

The invention claimed is:

1. A tri-state line driver, comprising:
first and second transistors coupled in series between an output node and first supply rail, wherein sources of the first and second transistors are operatively connected to each other, and wherein (1) the first supply rail is positive, and the first and second transistors are P-type transistors or (2) the first supply rail is negative or a local ground, and the first and second transistors are N-type transistors; and
a voltage limiter connected (1) between a source of the first transistor and a gate of the first transistor or (2) between a source of the second transistor and a gate of the second transistor, wherein the voltage limiter includes a resistor.

2. A tri-state line driver as claimed in claim 1, further comprising third and fourth transistors connected in series between the output node and second supply rail, different from the first supply rail, wherein the third and fourth transistors have their sources connected together.

3. A tri-state line driver as claimed in claim 2, further comprising a voltage limiter connected between the source of the third transistor and a gate of the third transistor.

4. A tri-state line driver as claimed in claim 1, in which the sources of the first and second transistors are connected by a high impedance path or a uni-directional current flow device to the first supply rail.

5. A tri-state line driver as claimed in claim 1, wherein the first supply rail is negative or a local ground, the first and second transistors are N-type transistors, and the tri-state line driver further includes:
a fifth transistor and a sixth transistor;
wherein the fifth transistor is a P-type transistor having its source operatively connected to the source of the first transistor, its drain connected to a second output node, and its gate connected to a fifth input node; and
wherein the sixth transistor is an N-type transistor having its source connected to the source of the second transistor, its drain connected to the second output node, and its gate connected to a sixth input node.

6. The tri-state line driver of claim 1, wherein the tri-state line driver is to drive in accordance with RS485 or RS232.

7. A differential tri-state buffer comprising first to sixth transistors, wherein:
drains of the first and third transistors are connected to a first output node;
drains of the fifth and sixth transistors are connected to a second output node;
a drain of the second transistor is connected to a positive supply rail;
a drain of the fourth transistor is connected to a negative supply rail;
sources of the first, second and fifth transistors are connected to a first shared node;
sources of the third, fourth and sixth transistors are connected to a second shared node which is connected to a substrate of a die or to a negative supply rail by way of a high impedance path or a uni-directional current flow device;
each of the first to sixth transistors is associated with a respective gate-to-source voltage limiting component;
the first to third transistors are P-type transistors and the fourth to sixth transistors are N-type transistors; and
the first shared node is connected to the positive supply rail by way of a high impedance path or a uni-directional current flow device.

8. A bus driver, comprising:
first and second transistors coupled in series between an output node and first supply rail, wherein sources of the first and second transistors are operatively connected to each other; and
a pre-driver circuit including a third transistor and a diode, wherein the diode is arranged in series with the third transistor to block current flow in response to a unipolar threat voltage falling outside of a supply voltage.

9. A bus driver as claimed in claim 8, wherein the pre-driver circuit further includes a fourth transistor, wherein the third and fourth transistors are arranged between the first supply rail and a second supply rail, and the diode is connected between drains of the third and fourth transistors.

10. The bus driver of claim 8, wherein the bus driver is to drive in accordance with RS485 or RS232.

11. An integrated circuit, comprising:
a bus driver including first and second transistors coupled in series between an output node and first supply rail, wherein sources of the first and second transistors are operatively connected to each other, and the bus driver is to drive in accordance with RS485 or RS232; and
a receiver connected to the output node.

12. A tri-state line driver, comprising:
first and second transistors coupled in series between an output node and first supply rail, wherein:
sources of the first and second transistors are operatively connected to each other; and
(1) the first supply rail is positive, and the first and second transistors are P-type transistors or (2) the first supply rail is negative or a local ground, and the first and second transistors are N-type transistors; and
the first and second transistors are DMOS transistors; and
the first and second transistors are selected to withstand a drain-source voltage greater than a first value representing a maximum permissible voltage at the output node.

13. The tri-state line driver of claim 12, wherein the tri-state line driver is to drive in accordance with RS485 or RS232.

* * * * *